(12) United States Patent
Choi et al.

(10) Patent No.: US 9,692,002 B2
(45) Date of Patent: Jun. 27, 2017

(54) ORGANIC LIGHT EMITTING DISPLAY DEVICE

(71) Applicant: LG DISPLAY CO., LTD., Seoul (KR)

(72) Inventors: Dongil Choi, Seoul (KR); EunJung Park, Goyang-si (KR); Sangkyoung Moon, Ulsan (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/135,238

(22) Filed: Apr. 21, 2016

(65) Prior Publication Data

US 2017/0033307 A1    Feb. 2, 2017

(30) Foreign Application Priority Data

Jul. 30, 2015  (KR) .................. 10-2015-0108036

(51) Int. Cl.
*H01L 51/50* (2006.01)
*H01L 51/52* (2006.01)
*H01L 27/32* (2006.01)

(52) U.S. Cl.
CPC ...... *H01L 51/5064* (2013.01); *H01L 27/3211* (2013.01); *H01L 27/3244* (2013.01); *H01L 51/5265* (2013.01); *H01L 51/5278* (2013.01); *H01L 51/5056* (2013.01); *H01L 2251/558* (2013.01)

(58) Field of Classification Search
CPC ............. H01L 51/5064; H01L 27/3211; H01L 27/3244
See application file for complete search history.

(56) References Cited

U.S. PATENT DOCUMENTS

| 2014/0353624 | A1* | 12/2014 | Kim ................... H01L 51/5016 257/40 |
| 2015/0188087 | A1 | 7/2015 | Lee |
| 2015/0194471 | A1 | 7/2015 | Lee |
| 2015/0287948 | A1* | 10/2015 | Fukase ................. H01L 51/504 257/40 |
| 2016/0204388 | A1* | 7/2016 | Hofle .................. H01L 51/5278 257/40 |

\* cited by examiner

*Primary Examiner* — Jarrett Stark
(74) *Attorney, Agent, or Firm* — Dentons US LLP (57) ABSTRACT

Disclosed is an organic light emitting display device that comprises a first light emitting unit between a first electrode and a second electrode, the first light emitting unit including a first hole transporting layer and a first light emitting layer; and a second light emitting unit between the first light emitting unit and the second electrode, the second light emitting unit including a second hole transporting layer and a second light emitting layer that emits a light of the same color as a light emitted by the first light emitting layer. An increase in driving voltage caused by a shift of an emission zone in the first light emitting layer or the second light emitting layer by prolonged driving is minimized which solves a problem of increased power consumption and improves the lifetime of the organic light emitting display device.

14 Claims, 9 Drawing Sheets

ORGANIC LIGHT EMITTING DISPLAY DEVICE

CROSS-REFERENCE TO RELATED APPLICATIONS

This application claims the priority of Korean Patent Application No. 10-2015-0108036 filed on Jul. 30, 2015 in the Korean Intellectual Property Office, the disclosure of which is incorporated herein by reference for all purposes as if fully set forth herein.

BACKGROUND

Field of the Invention

The present disclosure relates to an organic light emitting display device. More particularly, the disclosure relates to an organic light emitting display device having a longer lifetime by minimizing an increase in driving voltage of an organic light emitting element according to time; and thus, solving a problem of an increase in power consumption.

Description of the Related Art

An organic light emitting display (OLED) device is a next-generation display device having a self-luminance characteristic. The OLED device does not need a separate light source, unlike a liquid crystal display device. Thus, the OLED device can be manufactured into a lightweight and thin form. Further, the OLED device is advantageous in terms of a viewing angle, contrast, a response speed, power consumption, and the like. Therefore, the OLED device has received much attention as a next-generation display device.

SUMMARY

An organic light emitting display (OLED) device is a display device in which holes and electrons are respectively injected from two electrodes and recombined into excitons in a light emitting layer and the excitons emit a light having a specific wavelength during energy release. The OLED device has a self-luminance characteristic.

However, the OLED device has a problem of a shorter lifetime than other display devices such as a liquid crystal display device. To be specific, if the OLED device is driven for a long time, an emission zone in the light emitting layer where recombination of the holes and the electrons intensively occurs is shifted toward another organic layer adjacent to the light emitting layer. In this case, an interface between the light emitting layer and the organic layer adjacent to the light emitting layer as well as the light emitting layer may be degraded. Such a change in characteristic causes an increase in driving voltage of the OLED device. Therefore, power consumption of the OLED device is increased and a lifetime of the OLED device is decreased.

Accordingly, the inventors of the present invention recognized the above-described problems and conducted various experiments for reducing an increase in driving voltage caused by a shift of an emission zone. The inventors of the present invention optimized a structure of organic layers, particularly, a hole transporting layer, between two electrodes through the various experiments. Then, the inventors of the present invention invented a new OLED device with improved power consumption.

Accordingly, an advantage of the present disclosure is to provide an OLED device having improved power consumption and improved lifetime by configuring a plurality of hole transporting layers to have a thickness ratio for minimizing an increase in driving voltage caused by a shift of an emission zone due to prolonged driving.

The advantages of the present disclosure are not limited to the aforementioned advantages, and other advantages, which are not mentioned above, will be apparent to a person having ordinary skill in the art from the following description.

According to an aspect of the present disclosure, there is provided an OLED device comprising: a first light emitting unit positioned between a first electrode and a second electrode and including a first hole transporting layer and a first light emitting layer; and a second light emitting unit positioned between the first light emitting unit and the second electrode and including a second hole transporting layer and a second light emitting layer that emits a light of the same color as a light emitted by the first light emitting layer. According to an exemplary embodiment of the present disclosure, the first hole transporting layer and the second hole transporting layer have a thickness ratio for minimizing an increase in driving voltage caused by a shift of an emission zone in the first light emitting layer or in the second light emitting layer due to prolonged driving. Therefore, it is possible to solve a problem of an increase in power consumption of the OLED device and thus possible to improve a lifetime of the OLED device. Preferably, the first hole transporting layer and the second hole transporting layer have a thickness ratio that results in the emission zone in the first light emitting layer or in the second light emitting layer to be biased toward an upper part or biased toward a lower part with respect to a central part in the first light emitting layer or in the second light emitting layer. Preferably, a thickness of the second hole transporting layer is greater than a thickness of the first hole transporting layer. Preferably, a thickness ratio of the first hole transporting layer to the second hole transporting layer is from 1:1.1 to 1:1.5. Preferably, the sum of the thickness of the first hole transporting layer and the thickness of the second hole transporting layer is from 750 Å to 1,150 Å. Preferably, the first hole transporting layer and the second hole transporting layer are formed of the same material. Preferably, wherein a distance between the first electrode and the second electrode is from 1,700 Å to 3,000 Å. This results in constructive interference being generated between light emitted from the first light emitting layer and light emitted from the second light emitting layer due to micro-cavity effects. Preferably, a distance between the first light emitting layer and the second light emitting layer is from 500 Å to 750 Å. Preferably, the first light emitting layer and the second light emitting layer have a patterned structure divided for each pixel, respectively, and the first hole transporting layer and the second hole transporting layer have a common structure disposed throughout a plurality of pixels, respectively.

According to another aspect of the present disclosure, there is provided an OLED device of a top-emission type that includes a plurality of pixels adjacent to each other. The OLED device comprises: a plurality of first electrodes respectively corresponding to the plurality of pixels and spaced apart from each other; and a first common hole transporting layer on the plurality of first electrodes. Further, the OLED device includes: a plurality of first patterned light emitting layers on the first common hole transporting layer corresponding to the plurality of pixels respectively; a second common hole transporting layer on the plurality of first patterned light emitting layers that has a greater thickness than the first common hole transporting layer; a plurality of second patterned light emitting layers on the second common hole transporting layer corresponding to the plurality of pixels respectively; and a second electrode on the plurality of second patterned light emitting layers. Therefore, it is possible to solve a problem of an increase in driving voltage or delta voltage of the OLED device. Preferably, a thickness ratio of the first common hole transporting layer to the second common hole transporting layer is from 1:1.1 to 1:1.5. Preferably, the first common hole transporting layer and the second common hole transporting layer are formed of the same material. Preferably, the sum of the thickness of the first common hole transporting layer and the thickness of the second common hole transporting layer is from 750 Å to 1,150 Å. Preferably, in each of the plurality of pixels, a distance between the first electrode and the second electrode is from 1,700 Å to 3,000 Å, which results in constructive interference being generated between a light emitted from the first patterned light emitting layer and a light emitted from the second patterned light emitting layer due to micro-cavity effects. Preferably, a distance between the first patterned light emitting layer and the second patterned light emitting layer is from 500 Å to 750 Å.

A first hole transporting layer and a second hole transporting layer have a thickness ratio for minimizing an increase in driving voltage caused by a shift of an emission zone in a first light emitting layer or a second light emitting layer due to prolonged driving. Therefore, it is possible to solve a problem of an increase in power consumption of an OLED device and thus possible to improve a lifetime of the OLED device.

The thickness ratio of the first hole transporting layer and the second hole transporting layer results in the emission zone to be biased toward an upper part or a lower part with respect to a central part of the light emitting layer. Therefore, it is possible to solve a problem of an increase in driving voltage or delta voltage of the OLED device.

Among two hole transporting layers formed of the same material, a hole transporting layer disposed closer to an anode has a smaller thickness than the other hole transporting layer. Therefore, it is possible to minimize an increase in driving voltage of the OLED device even in the case of prolonged driving.

A distance between two electrodes and a distance between two light emitting layers emitting lights of the same color are optimized. Therefore, it is possible to generate constructive interference due to micro-cavity effects of the light emitting layers and thus possible to improve a light efficiency and a lifetime of the OLED.

The effects of the present disclosure are not limited to the aforementioned effects, and other effects, which are not mentioned above, will be apparent to a person having ordinary skill in the art from the following description.

The descriptions in the objects, aspects, and effects do not specify essential features of claims and thus do not limit the right scope of present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE ILLUSTRATED EMBODIMENT

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like shown in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure.

The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When the time sequence between two or more incidents is described using the terms such as "after", "subsequent to", "next to", and "before", two or more incidents may be inconsecutive unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Since size and thickness of each component shown in the drawings are represented for convenience in explanation, the present disclosure is not necessarily limited to the shown size and thickness of each component.

The features of various embodiments of the present disclosure can be partially or entirely bonded to or combined with each other and can be interlocked and operated in technically various ways, and the embodiments can be carried out independently of or in association with each other.

Hereinafter, exemplary embodiments of the present disclosure will be described in detail with reference to the accompanying drawings.

Figure 1:
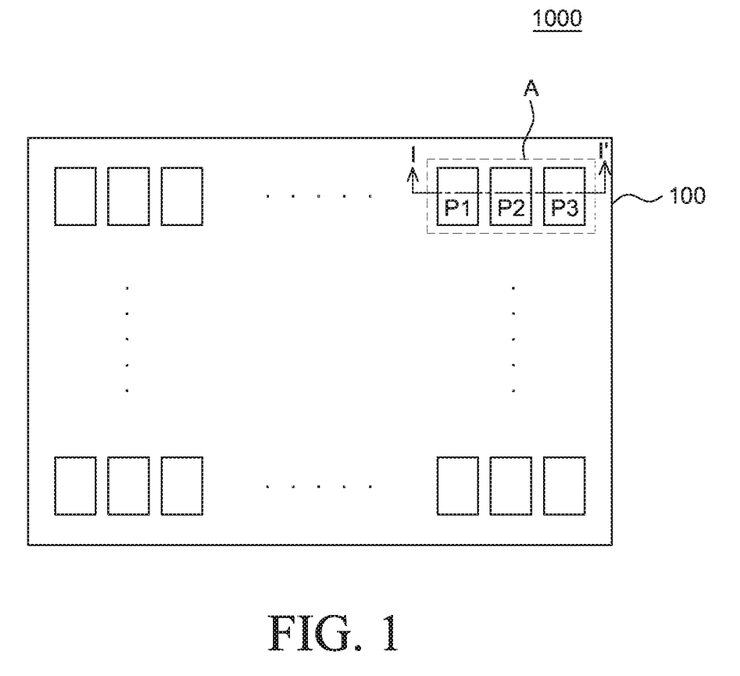
FIG. 1 is a plan view illustrating an OLED device according to an exemplary embodiment of the present disclosure.
Figure 2:
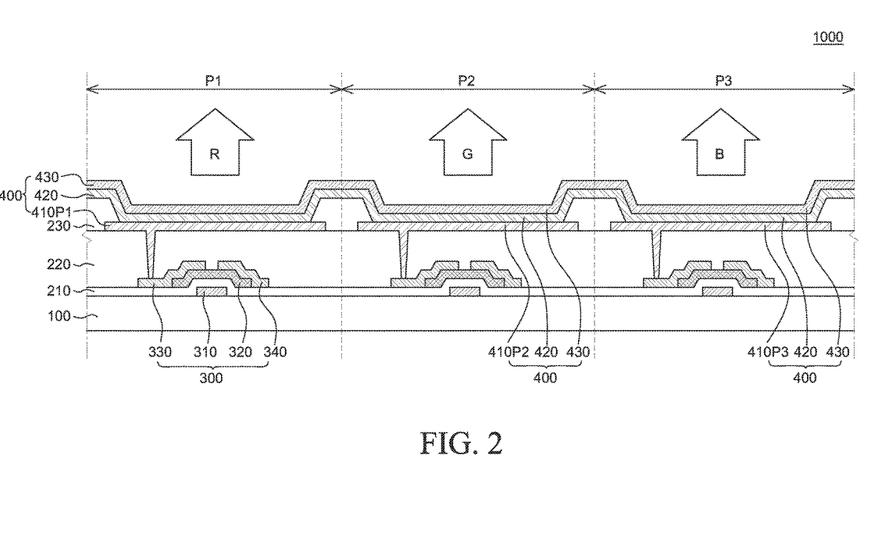
FIG. 2 is a cross-sectional view taken along a line I-I' of FIG. 1.

FIG. 1 is a plan view illustrating an organic light emitting display (OLED) device 1000 according to an exemplary embodiment of the present disclosure, and FIG. 2 is a cross-sectional view taken along a line I-I' of FIG. 1.

Referring to FIG. 1 and FIG. 2, an OLED device 1000 includes a plurality of pixels P1, P2, and P3 adjacent to each other. A pixel refers to a minimum unit that actually emits a light, and may also be referred to as a sub-pixel or a pixel region. Further, a plurality of pixels may form a minimum group capable of expressing a white light. FIG. 1 illustrates a first pixel P1, a second pixel P2, and a third pixel P3 as a single group "A", but is not necessarily limited thereto. The pixels may be designed in various ways. The plurality of pixels P1, P2, and P3 forming a single group emit lights of different colors. For example, according to a pixel design, the plurality of pixels P1, P2, and P3 may emit a red (R) light, a green (G) light, and a blue (B) light, respectively, as illustrated in FIG. 2.

Referring to FIG. 2, in the OLED device 1000, each pixel includes a thin film transistor (TFT) 300 and an organic light emitting element 400. The TFT 300 is disposed on a substrate 100 and configured to supply a signal to the organic light emitting element 400. The TFT 300 shown in FIG. 2 may be a driving thin film transistor connected to a first electrode 410 of the organic light emitting element 400. Although not shown in the drawings, each of the pixels P1, P2, and P3 may further include a switching thin film transistor or a capacitor for driving the organic light emitting element 400.

The substrate 100 may be formed of an insulation material. For example, the substrate 100 may be formed of a glass or may be formed into a flexible film formed of polyimide-based material.

The TFT 300 includes a gate electrode 310, an active layer 320, a source electrode 330, and a drain electrode 340. Referring to FIG. 2, the gate electrode 310 is formed on the substrate 100, and a gate insulation layer 210 covers the gate electrode 310. The active layer 320 is disposed on the gate insulation layer 210 so as to be overlapped with the gate electrode 310. The source electrode 330 and the drain electrode 340 are disposed to be spaced apart from each other on the active layer 320.

In the present disclosure, an overlap of two objects may mean that at least parts of the two objects are overlapped in a vertical relation between the two objects regardless of whether or not another object is present therebetween, and may also be referred to using various other terms.

The gate electrode 310, the source electrode 330, and the drain electrode 340 are formed of conductive materials. They may be formed of, for example, any one of molybdenum (Mo), aluminum (Al), chromium (Cr), gold (Au), titanium (Ti), nickel (Ni), neodymium (Nd), and copper (Cu) or alloys thereof, but are not limited thereto, and may be formed of various materials.

The active layer 320 may be formed of any one of amorphous silicon (a-Si), polycrystalline silicon (poly-Si), oxide, and an organic material according to a kind of the active layer 320, but is not limited thereto.

The gate insulation layer 210 may include a single layer or a plurality of layers formed of an inorganic material, and may be formed of silicon oxide ($SiO_x$), silicon nitride ($SiN_x$), and the like.

FIG. 2 illustrates the TFT 300 as having a staggered structure, but is not limited thereto. The TFT 300 may have a coplanar structure.

A planarization layer 220 that exposes a part of the source electrode 330 is disposed on the TFT 300. The planarization layer 220 may include a single layer or a plurality of layers and may be formed of an organic material. To be specific, the planarization layer 220 may be formed of polyimide, acryl, and the like.

Although not shown in FIG. 2, a passivation layer may be further formed between the planarization layer 220 and the TFT 300. The passivation layer may be formed of an inorganic material, may protect the TFT 300, and may also expose a part of the source electrode 330 in the same manner as the planarization layer 220.

The organic light emitting element 400 is disposed on the planarization layer 220, and includes the first electrode 410, a light emitting unit 420, and a second electrode 430. The OLED device 1000 according to an exemplary embodiment of the present disclosure is an OLED device of a top-emission type, and, thus, a light emitted by the light emitting unit 420 penetrates the second electrode 430 and is emitted in an upward direction.

Figure 3:
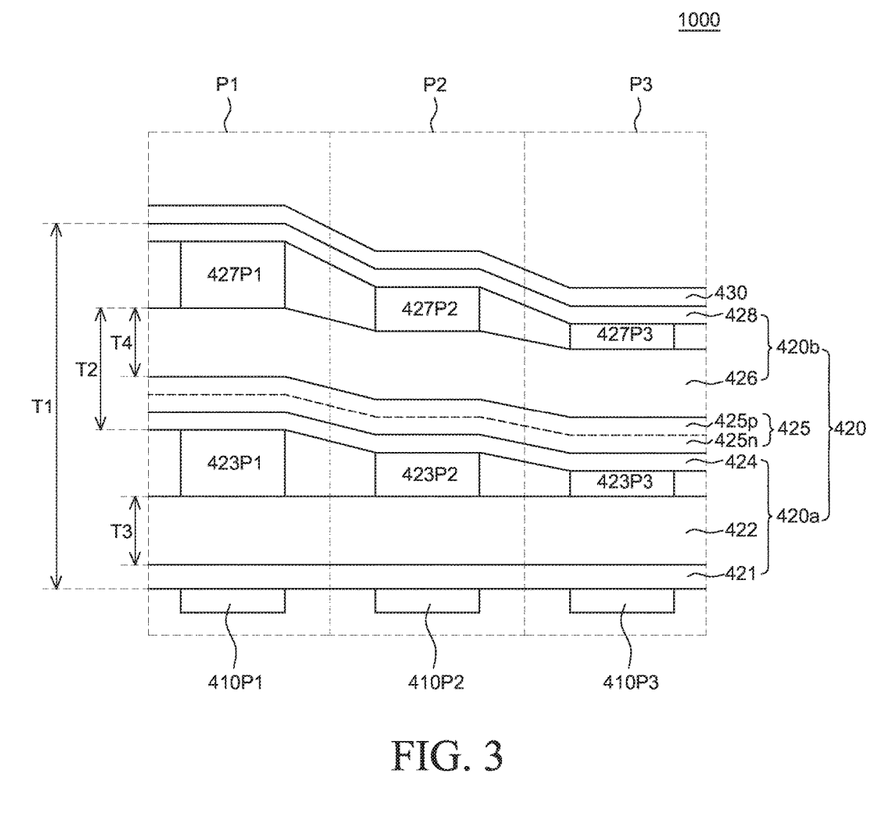
FIG. 3 is a cross-sectional view illustrating main components of a portion A illustrated in FIG. 1.

FIG. 3 is a cross-sectional view illustrating main components of the portion A illustrated in FIG. 1. To be specific, FIG. 3 is a cross-sectional view explaining a structure of the organic light emitting element 400 of the plurality of pixels P1, P2, and P3 adjacent to each other in a single group.

Referring to FIG. 2 and FIG. 3, a plurality of first electrodes 410P1, 410P2, and 410P3 are disposed to be spaced apart from each other and correspond to the respective pixels P1, P2, and P3. The plurality of first electrodes 410P1, 410P2, and 410P3 is configured to supply holes to light emitting layers 423 and 427 of the light emitting unit 420. Each of the plurality of first electrodes 410P1, 410P2, and 410P3 is connected to the source electrode 330 of the TFT 300. The plurality of first electrodes 410P1, 410P2, and 410P3 may be referred to as anodes.

Although not shown in the drawings, the first electrode 410 may be connected to the drain electrode 340 according to a kind of the TFT 300. Further, since the OLED device 1000 of the present disclosure is an OLED device of a top-emission type, the plurality of first electrodes 410P1, 410P2, and 410P3 may include a reflective layer. For example, the first electrode 410 may have a two-layer structure including a transparent layer and a reflective layer stacked in sequence, or a three-layer structure including a transparent layer, a reflective layer, and a transparent layer stacked in sequence. The transparent layer may be formed of a transparent conductive oxide (TCO) material such as indium tin oxide (ITO) or indium zinc oxide (IZO). The reflective layer may be formed of a metal material such as copper (Cu), silver (Ag), and palladium (Pd).

The second electrode 430 is disposed commonly throughout the plurality of pixels P1, P2, and P3, and configured to supply electrons to the light emitting layers 423 and 427 of the light emitting unit 420. The second electrode 430 needs to transmit a light from the light emitting unit 420. Thus, the second electrode 430 may be formed of a metal material having a very small thickness, for example, from 150 Å to 250 Å, or a transparent material. The second electrode 430 may be formed of, for example, silver (Ag), magnesium (Mg), indium zinc oxide (IZO), indium tin oxide (ITO), and the like. The second electrode 430 may be referred to as a cathode.

The OLED device 1000 according to an exemplary embodiment of the present disclosure includes a first light emitting unit 420a, a second light emitting unit 420b, and a charge generation layer 425 between the first electrode 410 and the second electrode 430 as shown in FIG. 3.

The first light emitting unit 420a includes a hole injection layer 421, a first hole transporting layer 422, a first light emitting layer 423, and a first electron transporting layer 424.

The hole injection layer 421 is disposed on the first electrode 410 and smoothly injects holes supplied from the first electrode 410 to the first light emitting layer 423. The hole injection layer 421 may be formed of 4,4',4"-tris(3-methylphenylphenylamino) triphenylamine (MTDATA), copper phthalocyanine (CuPc), or poly(3,4-ethylenedioxythiophene, polystyrene sulfonate (PEDOT/PSS), but is not necessarily limited thereto. Further, the hole injection layer 421 may have a thickness of from about 30 Å to about 100 Å.

The first hole transporting layer 422 is disposed on the hole injection layer 421 and smoothly transports holes supplied from the first electrode 410 to the first light emitting layer 423. The first hole transporting layer 422 may be formed of N,N'-diphenyl-N,N'-bis(3-methylphenyl)-1,1'-biphenyl-4,4'-diamine (TPD) or N,N'-di(naphthalen-1-yl)-N,N'-diphenyl-benzidine (NPB), but is not necessarily limited thereto.

The first electron transporting layer 424 is disposed on the first light emitting layer 423 and smoothly transports electrons supplied from the charge generation layer 425 to the first light emitting layer 423. The first electron transporting layer 424 may be formed of oxadiazole, triazole, phenanthroline, benzoxazole, benzthiazole, or the like, but is not necessarily limited thereto. Further, the first electron transporting layer 424 may have a thickness of from about 50 Å to about 200 Å.

The hole injection layer 421, the first hole transporting layer 422 and the first electron transporting layer 424 have a common structure each disposed throughout the plurality of pixels P1, P2, and P3. In other words, each of the hole injection layer 421, the first hole transporting layer 422 and the first electron transporting layer 424 is extended on the plurality of first electrodes 410P1, 410P2, and 410P3 corresponding to the first pixel P1, the second pixel P2, and the third pixel P3. The layers having the common structure are formed into the same shape in the pixels P1, P2, and P3 without patterning for each of the pixels P1, P2, and P3. For example, the layers may be deposited using a common mask open to all of the pixels P1, P2, and P3.

In comparison, the first light emitting layer 423 has a patterned structure divided for each of the pixels P1, P2, and P3. Referring to FIG. 3, a first light emitting layer 423P1 of the first pixel P1 is disposed to be overlapped with the first electrode 410P1 of the first pixel P1, and may emit, for example, a red light. A first light emitting layer 423P2 of the second pixel P2 is disposed to be overlapped with the first electrode 410P2 of the second pixel P2, and may emit, for example, a green light. A first light emitting layer 423P3 of the third pixel P3 is disposed to be overlapped with the first electrode 410P3 of the third pixel P3, and may emit, for example, a blue light. In the first light emitting layer 423, the light emitting layers 423P1, 423P2, and 423P3 emitting lights of different colors are patterned for the pixels P1, P2, and P3, respectively. The first light emitting layer 423 may be deposited and patterned using a mask, for example, a fine metal mask (FMM), open and divided for each of the pixels P1, P2, and P3. The first patterned light emitting layers 423P1, 423P2, and 423P3 may have different heights with respect to each other. Although FIG. 3 shows that there are spaces among the first patterned light emitting layers 423P1, 423P2 and 423P3 for convenience in explanation, the first electron transporting layer 424 may be positioned between the first patterned light emitting layers 423P1, 423P2 and 423P3.

The second light emitting unit 420b is disposed between the first light emitting unit 420a and the second electrode 430. The second light emitting unit 420b includes a second hole transporting layer 426, a second light emitting layer 427, and a second electron transporting layer 428.

The second hole transporting layer 426 is disposed on the charge generation layer 425 and smoothly transports holes supplied from the charge generation layer 425 to the second light emitting layer 427.

The second electron transporting layer 428 is disposed on the second light emitting layer 427 and smoothly transports electrons supplied from the second electrode 430 to the second light emitting layer 427. The second electron transporting layer 428 may be formed of oxadiazole, triazole, phenanthroline, benzoxazole, or benzthiazole, but is not necessarily limited thereto. Further, the second electron transporting layer 428 may have a thickness of from about 250 Å to about 350 Å.

The second hole transporting layer 426 and the second electron transporting layer 428 have a common structure each disposed throughout the plurality of pixels P1, P2, and P3 in the same manner as the hole injection layer 421, the first hole transporting layer 422, and the first electron transporting layer 424. In other words, the second hole transporting layer 426 and the second electron transporting layer 428 are formed into the same shape in the pixels P1, P2, and P3 without patterning for each of the pixels P1, P2, and P3.

In comparison, the second light emitting layer 427 has a patterned structure divided for each of the pixels P1, P2, and P3 in the same manner as the first light emitting layer 423. The second patterned light emitting layers 427P1, 427P2, and 427P3 may have different heights with respect to each other. The second light emitting layer 427 emits a light of the same color as a light emitted by the first light emitting layer 423. To be more specific, the first light emitting layer 423P1 and a second light emitting layer 427P1 of the first pixel P1 may emit lights of the same color, for example, red lights. In other words, the first light emitting layer 423P1 and the second light emitting layer 427P1 of the first pixel P1 emit lights having the same peak wavelength. Each of the first light emitting layer 423P1 and the second light emitting layer 427P1 may have a peak wavelength from 600 nm to 650 nm. In this case, even if the first light emitting layer 423P1 and the second light emitting layer 427P1 do not have exactly the same peak wavelength, these layers can be regarded as emitting lights of the same color. If the first light emitting layer 423P1 and the second light emitting layer 427P1 of the first pixel P1 are light emitting layers emitting red lights, the first pixel P1 is a red pixel.

Further, the first light emitting layer 423P2 and a second light emitting layer 427P2 of the second pixel P2 may emit lights of the same color, for example, green lights. In other words, the first light emitting layer 423P2 and the second light emitting layer 427P2 of the second pixel P2 emit lights having the same peak wavelength. Each of the first light emitting layer 423P2 and a second light emitting layer 427P2 may have a peak wavelength from 540 nm to 580 nm. In this case, even if the first light emitting layer 423P2 and a second light emitting layer 427P2 do not have exactly the same peak wavelength, these light emitting layers can be regarded as emitting lights of the same color. If the first light emitting layer 423P2 and a second light emitting layer 427P2 of the second pixel P2 are light emitting layers emitting green lights, the second pixel P2 is a green pixel.

Likewise, the first light emitting layer 423P3 and a second light emitting layer 427P3 of the third pixel P3 may emit lights of the same color, for example, blue lights. In other words, the first light emitting layer 423P3 and the second light emitting layer 427P3 of the third pixel P3 emit lights having the same peak wavelength. Each of the first light emitting layer 423P3 and the second light emitting layer 427P3 may have a peak wavelength from 440 nm to 480 nm. In this case, even if the first light emitting layer 423P3 and the second light emitting layer 427P3 do not have exactly the same peak wavelength, these light emitting layers can be regarded as emitting lights of the same color. If the first light emitting layer 423P3 and the second light emitting layer 427P3 of the third pixel P3 are light emitting layers emitting blue lights, the third pixel P3 is a blue pixel.

The hole injection layer 421, the first hole transporting layer 422, the first electron transporting layer 424, the second hole transporting layer 426 and the second electron transporting layer 428 have a common structure each disposed throughout the plurality of pixels P1, P2, and P3. Therefore, they may be referred to as a common hole injection layer 421, a first common hole transporting layer 422, a first common electron transporting layer 424, a second common hole transporting layer 426, and a second common electron transporting layer 428, respectively.

Meanwhile, the first light emitting layer 423 and the second light emitting layer 427 have a patterned structure divided for each of the pixels P1, P2, and P3. Therefore, they may be referred to as a plurality of first patterned light emitting layers 423 and a plurality of second patterned light emitting layers 427, respectively.

The charge generation layer 425 is disposed between the first light emitting unit 420a and the second light emitting unit 420b. The charge generation layer 425 controls a balance of charges between the first light emitting unit 420a and the second light emitting unit 420b. The charge generation layer 425 may include an N-type charge generation layer 425n and a P-type charge generation layer 425p.

The N-type charge generation layer 425n is disposed adjacent to the first light emitting unit 420a and supplies electrons to the first light emitting unit 420a. The N-type charge generation layer 425n may be formed into an organic layer doped with alkali metal such as lithium (Li), sodium (Na), potassium (K), or cesium (Cs), or alkali earth metal such as magnesium (Mg), strontium (Sr), barium (Ba), or radium (Ra), but is not necessarily limited thereto. Further, the N-type charge generation layer 425n may have a thickness of from about 50 Å to about 200 Å.

The P-type charge generation layer 425p is disposed adjacent to the second light emitting unit 420b and supplies holes to the second light emitting unit 420b. The P-type charge generation layer 425p may be formed into an organic layer including a P-type dopant, but is not necessarily limited thereto. Further, the P-type charge generation layer 425p may have a thickness of from about 30 Å to about 100 Å.

In the OLED device 1000 according to an exemplary embodiment of the present disclosure, the first hole transporting layer 422 of the first light emitting unit 420a and the second hole transporting layer 426 of the second light emitting unit 420b have a thickness ratio. The thickness ratio is for minimizing an increase in driving voltage caused by a shift of an emission zone in the first light emitting layer 423 or in the second light emitting layer 427 due to prolonged driving of the OLED device 1000.

Details thereof will be described below with reference to FIG. 4A and FIG. 4B.

An emission zone EZ refers to a portion or a region where recombination of holes supplied from the first electrode 410 or the charge generation layer 425 and electrons supplied from the second electrode 430 or the charge generation layer 425 intensively occurs within the light emitting layers 423 and 427.

The emission zone EZ may be shifted due to prolonged driving of the OLED device 1000. For example, referring to FIG. 4A, the emission zone EZ may be formed at a central part of the light emitting layer 423. In this case, the emission zone EZ may be shifted toward an upper part of the light emitting layer 423 or toward the first electron transporting layer 424 as another organic layer adjacent to the light emitting layer 423 due to prolonged driving. In this case, an interface between the light emitting layer 423 and the first electron transporting layer 424 may be degraded. Such a change in characteristic causes an increase in driving voltage of the OLED device 1000. Therefore, power consumption of the OLED device 1000 is increased and a lifetime of the OLED device 1000 is decreased.

Figure 4A:
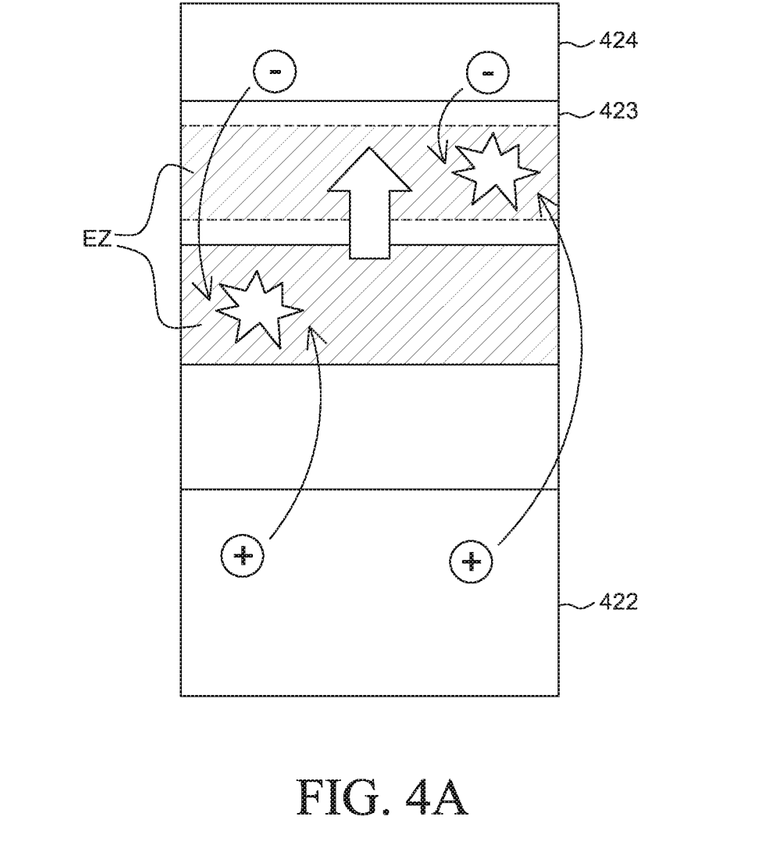
FIG. 4A and FIG. 4B are schematic cross-sectional views explaining a shift of an emission zone in a light emitting layer.
Figure 4B:
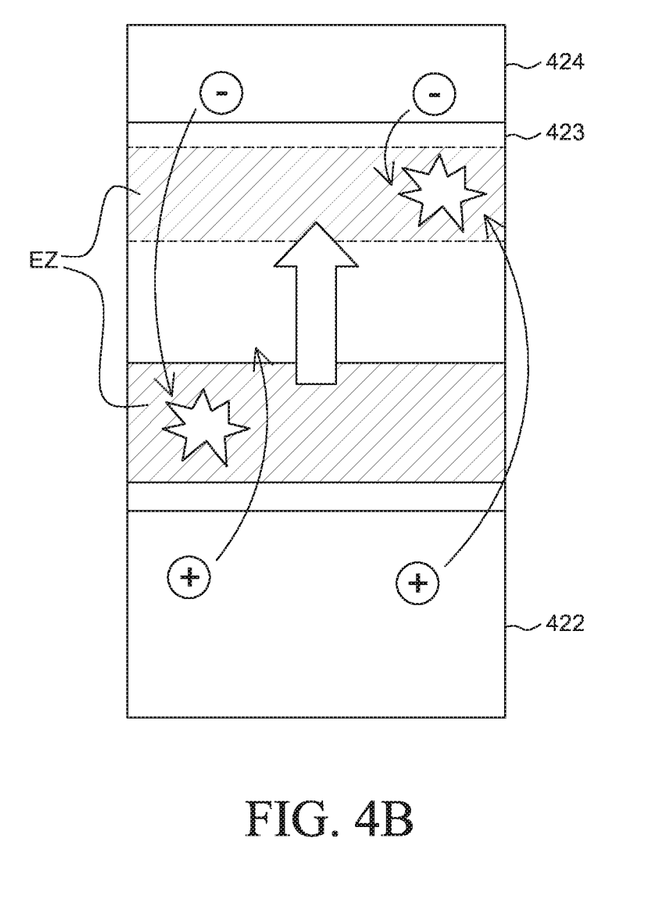

In comparison, referring to FIG. 4B, the emission zone EZ may be one-sided at a lower part with respect to the central part of the light emitting layer 423. In this case, a shift distance of the emission zone EZ toward the first electron transporting layer 424 is increased. Accordingly, a time for the emission zone EZ and the first electron transporting layer 424 to be close to each other is increased. That is, it is possible to reduce a change in characteristic of the interface between the light emitting layer 423 and the first electron transporting layer 424 caused by a shift of the emission zone EZ even in the case of prolonged driving.

FIG. 4A and FIG. 4B illustrate that the emission zone EZ is shifted in an upward direction, for example, a direction being close to the first electron transporting layer 424. However, the emission zone EZ may be shifted in a downward direction, for example, a direction being close to the first hole transporting layer 422, according to peak wavelengths of lights emitted from the light emitting layers 423 and 427 or thicknesses of the layers between the two electrodes 410 and 430.

Therefore, the emission zone EZ in the first light emitting layer 423 or in the second light emitting layer 427 may be one-sided at an upper part or a lower part with respect to the central part of the first light emitting layer 423 or in the second light emitting layer 427. In this case, it is possible to reduce a change in characteristic, such as degradation, of the interface between the light emitting layer 423 or 427 and another organic layer adjacent to the light emitting layer 423 or 427 caused by a shift of the emission zone EZ due to prolonged driving. Accordingly, it is possible to reduce an increase in driving voltage or delta voltage of the OLED device 1000 and thus possible to improve a lifetime of the OLED device 1000.

Referring back to FIG. 3, according to an exemplary embodiment of the present disclosure, a thickness T4 of the second hole transporting layer 426 may be greater than a thickness T3 of the first hole transporting layer 422 as shown. To be specific, a thickness ratio T3:T4 of the first hole transporting layer 422 and the second hole transporting layer 426 may be from 1:1.1 to 1:1.5. Therefore, the emission zone EZ can be one-sided at an upper part or a lower part within the first light emitting layer 423 or in the second light emitting layer 427. Further, the first hole transporting layer 422 and the second hole transporting layer 426 may be formed of the same material. In this case, it becomes easier to regulate the emission zone EZ according to the thickness ratio of the two hole transporting layers 422 and 426. Therefore, it is possible to minimize an increase in driving voltage or delta voltage caused by a shift of the emission zone EZ within the first light emitting layer 423 or in the second light emitting layer 427. Thus, it is possible to improve a lifetime of the OLED device 1000.

When controlling thicknesses of the other organic layers, for example, the electron transporting layers 424 and 428 or the hole injection layer 421, than the hole transporting layers 422 and 426, characteristics, such as a driving voltage or a driving current, of the OLED device 1000 may be greatly changed. Thus, it may become difficult to manage a deviation or a defect during a manufacturing process. When comparing with the other organic layers, the hole transporting layers 422 and 426 less affect the characteristics of the OLED device 1000. Therefore, locations of the emission zones EZ within the light emitting layers 423 and 427 may be controlled by controlling the thicknesses T3 and T4 of the hole transporting layers 422 and 426, respectively.

The sum of the thickness T3 of the first hole transporting layer 422 and the thickness T4 of the second hole transporting layer 426 may be from 750 Å to 1,150 Å. To be specific, the thickness T3 of the first hole transporting layer 422 may be from 350 Å to 550 Å, and the thickness T4 of the second hole transporting layer 426 may be from 400 Å to 600 Å. The respective thicknesses T3 and T4 of the first hole transporting layer 422 and the second hole transporting layer 426 and the sum (T3+T4) of the thicknesses are in the above-described ranges. Therefore, the emission zone EZ can be one-sided at an upper part or a lower part within the first light emitting layer 423 or within the second light emitting layer 427. That is, it is possible to minimize an increase in driving voltage caused by a shift of the emission zone EZ within the first light emitting layer 423 or within the second light emitting layer 427. Further, if the hole transporting layers 422 and 426 are too thin, their capability of transporting holes to the light emitting layers 423 and 427 may be decreased. Thus, the light efficiency of the OLED 1000 may be decreased. Furthermore, if the hole transporting layers 422 and 426 are too thick, a thickness of the OLED device 1000 may be increased or a time for forming the hole transporting layers 422 and 426 may be increased. Thus, a process tack time may be increased.

In the OLED device 1000 to which the above-described structure is applied according to an exemplary embodiment of the present disclosure, a distance T1 between the first electrode 410 and the second electrode 430 may have a value, which results in constructive interference being generated between light emitted from the first light emitting layer 423 and a light emitted from the second light emitting layer 427 due to micro-cavity effects. The first electrode 410 may include a transparent conductive layer formed of ITO or IZO and a reflective layer formed of a metal material. In this case, the distance T1 from a top surface of the reflective layer to a bottom surface of the second electrode 430 is the distance T1 between the first electrode 410 and the second electrode 430.

The micro-cavity effect refers to an improvement in light efficiency since lights emitted from the light emitting layers 423 and 427 are amplified between the two electrodes 410 and 430 through repeated reflection and re-reflection and constructive interference is thus generated. Further, initial locations of the emission zones EZ may vary depending on peak wavelengths of lights emitted from the light emitting layers 423 and 427 and thicknesses of the layers between the two electrodes 410 and 430. The light efficiency can be improved only when the emission zone EZ is located at a portion where constructive interference between lights emitted from the two light emitting layers 423 and 427 is generated due to the micro-cavity effects.

The thickness T4 of the second hole transporting layer 426 is greater than the thickness T3 of the first hole transporting layer 422 according to an exemplary embodiment of the present disclosure. In this structure, if the distance T1 between the first electrode 410 and the second electrode 430 is from 1,700 Å to 3,000 Å, locations of the emission zones EZ within the light emitting layers 423 and 427 are optimized. Thus, between the first electrode 410 and the second electrode 430, constructive interference between a light emitted from the first light emitting layer 423 and light emitted from the second light emitting layer 427 is effectively generated due to micro-cavity effects. Therefore, the light efficiency of the OLED 1000 can be improved.

The distance T1 between the first electrode 410 and the second electrode 430 is determined considering peak wavelengths of lights emitted from the first light emitting layer 423 and the second light emitting layer 427. As described above, the first light emitting layers 423P1, 423P2, and 423P3 patterned and disposed in the respective pixels P1, P2, and P3 emit lights of different colors for the respective pixels P1, P2, and P3. Further, the second light emitting layers 427P1, 427P2, and 427P3 patterned and disposed in the respective pixels P1, P2, and P3 emit lights of different colors for the respective pixels P1, P2, and P3.

Therefore, a distance between the first electrode 410P1 of the first pixel P1 and the second electrode 430, a distance between the first electrode 410P2 of the second pixel P2 and the second electrode 430, and a distance between the first electrode 410P3 of the third pixel P3 and the second electrode 430 may be different from each other. The distance T1 between the two electrodes 410 and 430 in each of the pixels P1, P2, and P3 may be controlled using the thicknesses of the first light emitting layer 423 and the second light emitting layer 427, which are patterned and formed in each of the pixels P1, P2, and P3. That is, the height of the first patterned light emitting layers 423P1, 423P2, 423P3 and the height of the second patterned light emitting layers 427P1, 427P2, 427P3 may be different for the respective pixels P1, P2, P3. Further, the second patterned light emitting layers 427P1, 427P2, and 427P3 may have a same height, respectively, as the corresponding first patterned light emitting layers 423P1, 423P2, and 423P3, or not.

The first pixel P1 may be a red pixel. In this case, each of the first light emitting layer 423P1 and the second light emitting layer 427P1 emitting lights of the same color may have a thickness of from 450 Å to 750 Å, which results in constructive interference being generated between the two electrodes 410P1 and 430 due to micro-cavity effects.

Further, the second pixel P2 may be a green pixel. In this case, each of the first light emitting layer 423P2 and the second light emitting layer 427P2 emitting lights of the same color may have a thickness of from 300 Å to 500 Å, which results in constructive interference being generated between the two electrodes 410P2 and 430 due to micro-cavity effects.

Furthermore, the third pixel P3 may be a blue pixel. In this case, each of the first light emitting layer 423P3 and the second light emitting layer 427P3 emitting lights of the same color may have a thickness of from 100 Å to 300 Å, which results in constructive interference being generated between the two electrodes 410P3 and 430 due to micro-cavity effects.

According to an exemplary embodiment of the present disclosure, the distance T2 between the two light emitting layers 423 and 427 in each of the pixels P1, P2, and P3 is also from 500 Å to 750 Å. Thus, the light efficiency of the OLED device 1000 can be further improved. The distance T2 between the two light emitting layers 423 and 427 emitting lights of the same color in the same pixel is from 500 Å to 750 Å. Thus, constructive interference between the two electrodes 410 and 430 due to micro-cavity effects can be further amplified. Further, when electrons and holes are respectively supplied from the charge generation layer 425 to the two light emitting layers 423 and 427, the thickness T4 of the second hole transporting layer 426 is preferably greater than the thickness of the electron transporting layer 424 to balance the supplies of electrons and holes.

Therefore, the OLED device 1000 includes the first light emitting unit 420a including the first patterned light emitting layer 423 and the first common hole transporting layer 422 and the second light emitting unit 420b including the second patterned light emitting layer 427 and the second common hole transporting layer 426 according to an exemplary embodiment of the present disclosure. In the OLED device 1000, the thickness T4 of the second common hole transporting layer 426 is greater than the thickness T3 of the first common hole transporting layer 422. Thus, it is possible to solve a problem of an increase in driving voltage or delta voltage of the OLED device 1000 caused by a shift of the emission zone EZ within the first or second patterned light emitting layer 423 or 427. Further, the first and second common hole transporting layers 422 and 426 respectively included in the first light emitting unit 420a and the second light emitting unit 420b are formed of the same material. The thickness T3 of the first common hole transporting layer 422 included in the first light emitting unit 420a, i.e., the hole transporting layer 422 disposed close to the first electrode 410 or the anode, is smaller than the thickness T4 of the second common hole transporting layer 426 included in the second light emitting unit 420b. Thus, it is possible to minimize an increase in driving voltage of the OLED device 1000 even in the case of prolonged driving.

Figure 5:
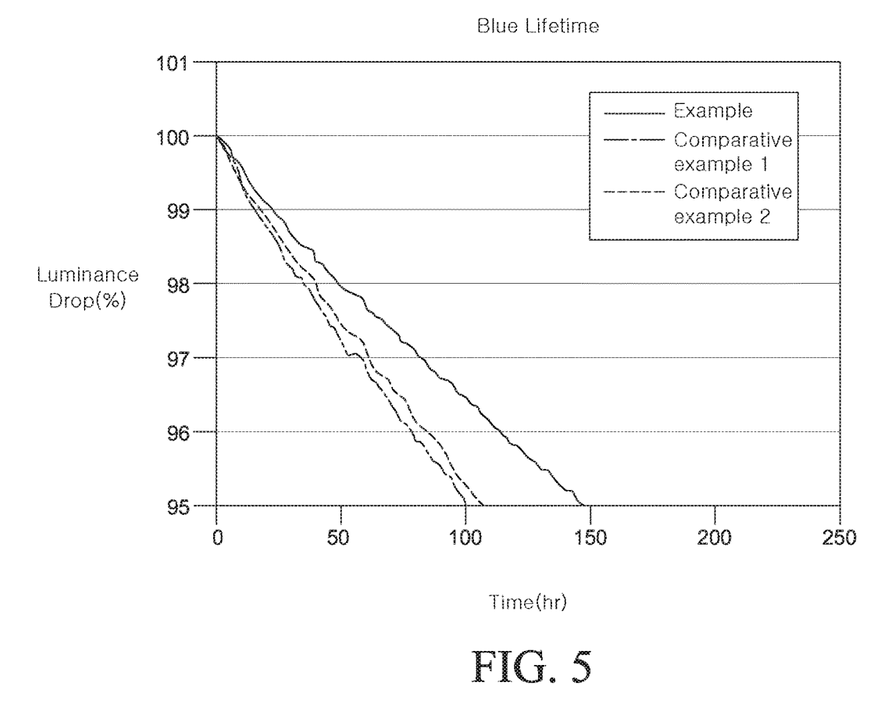
FIG. 5 through FIG. 7 are graphs illustrating results of evaluation on a lifetime according to Comparative Examples and Example of the present disclosure.
Figure 6:
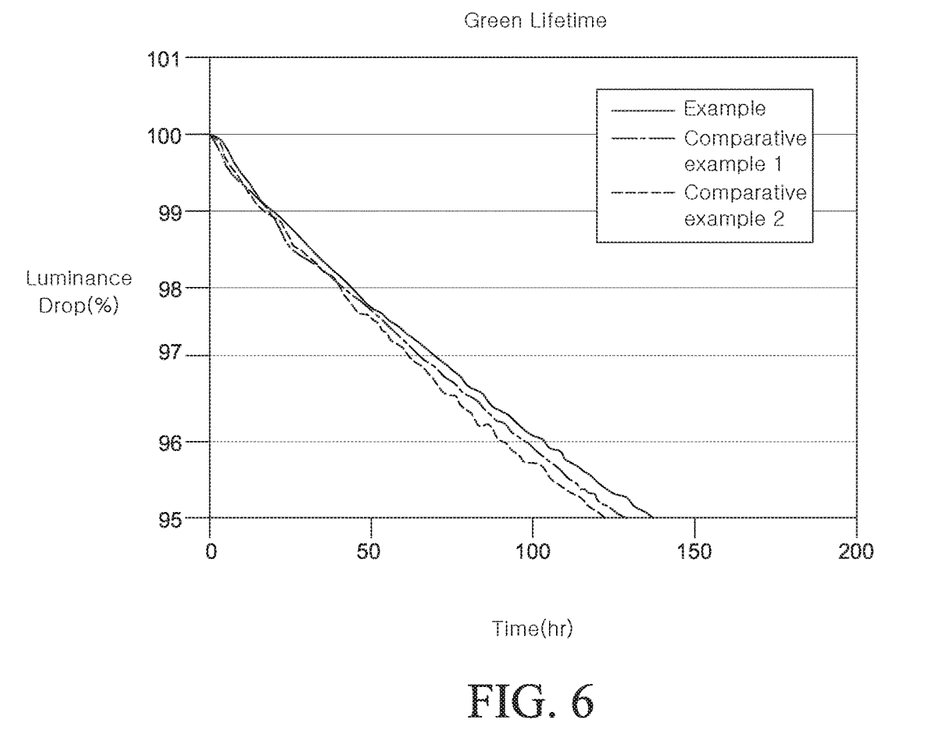
Figure 7:
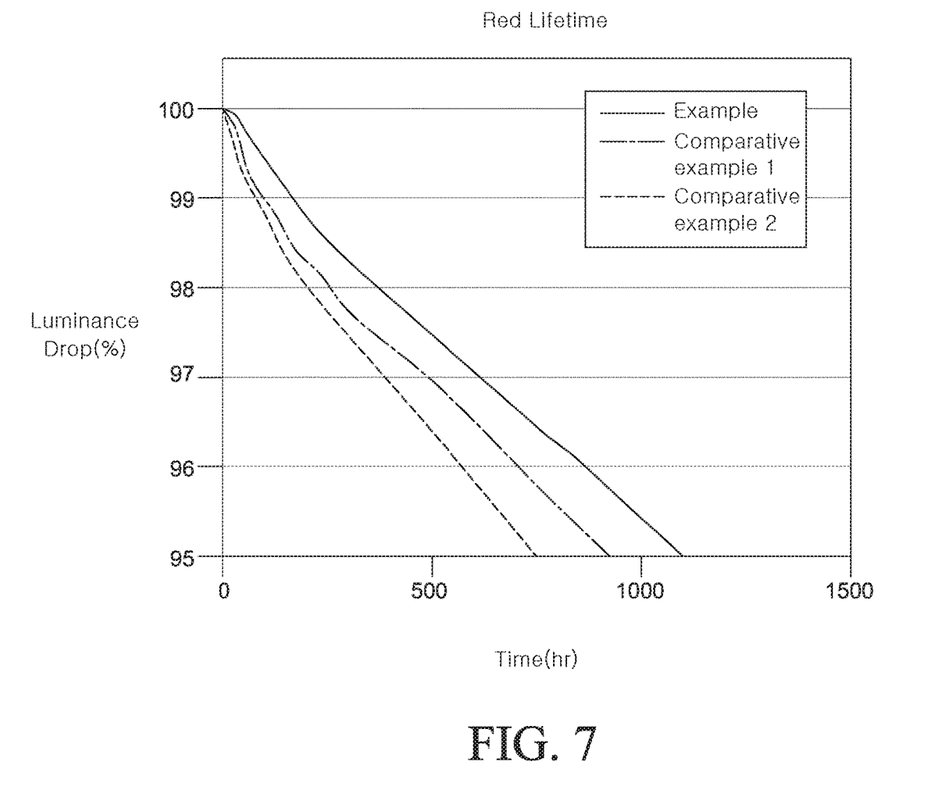

FIG. 5 through FIG. 7 are graphs illustrating results of evaluation on a lifetime according to Comparative Examples and Example of the present disclosure.

As for FIG. 5, in the OLED device 1000 according to an exemplary embodiment of the present disclosure illustrated in FIG. 1 through FIG. 3, if the plurality of patterned light emitting layers 423 and 427 emit blue lights, the thickness T3 of the first hole transporting layer 422 and the thickness T4 of the second hole transporting layer 426 may be applied as listed in the following Table 1 to a structure. FIG. 5 is a graph illustrating a result of evaluation on a lifetime of the above-described structure according to Comparative Examples and Example. Referring to Table 1, a thickness of any one of the first hole transporting layer 422 and the second hole transporting layer 426 is assumed as 100% and a thickness of the other is compared and expressed.

TABLE 1

|  | Thickness (T3) of first hole transporting layer | Thickness (T4) of second hole transporting layer | Thickness ratio (T3:T4) |
| --- | --- | --- | --- |
| Example | 80% | 100% | 1:1.25 |
| Comparative Example 1 | 100% | 80% | 1:0.8 |
| Comparative Example 2 | 100% | 50% | 1:0.5 |

Referring to FIG. 5, the thickness T4 of the second hole transporting layer is greater than the thickness T3 of the first hole transporting layer in a structure according to Example. To be specific, a thickness ratio T3:T4 of the first hole transporting layer to the second hole transporting layer is 1:1.25 in this structure. With this structure, it can be seen that when an initial luminance of the OLED device was assumed as 100%, there was a luminance drop of about 5% after a lapse of about 150 hrs.

In comparison, the thickness T4 of the second hole transporting layer is smaller than the thickness T3 of the first hole transporting layer in structures according to Comparative Example 1 and Comparative Example 2. To be specific, thickness ratios T3:T4 of the first hole transporting layer to the second hole transporting layer are 1:0.8 and 1:0.5 in these structures. With these structures, it can be seen that when an initial luminance of the OLED device was assumed as 100%, there was a luminance drop of about 5% after a lapse of about 100 hrs.

That is, in the OLED device according to an exemplary embodiment of the present disclosure, the thickness of the second hole transporting layer is greater than the thickness of the first hole transporting layer. Thus, it can be seen that a lifetime of the OLED device including the plurality of patterned light emitting layers emitting blue lights was greatly increased by about 50%.

In the OLED device 1000 according to an exemplary embodiment of the present disclosure illustrated in FIG. 1 through FIG. 3, if the plurality of patterned light emitting layers 423 and 427 emit green lights, the thickness T3 of the first hole transporting layer 422 and the thickness T4 of the second hole transporting layer 426 may be applied as listed in the above Table 1 to a structure. Similar to FIG. 5, FIG. 6 is a graph illustrating a result of evaluation on a lifetime of the above-described structure according to Comparative Examples and Example.

Referring to FIG. 6, the thickness T4 of the second hole transporting layer is greater than the thickness T3 of the first hole transporting layer in a structure according to Example. With this structure, it can be seen that when an initial luminance of the OLED device was assumed as 100%, there was a luminance drop of about 5% after a lapse of about 135 hrs.

In comparison, the thickness T4 of the second hole transporting layer is smaller than the thickness T3 of the first hole transporting layer in structures according to Comparative Example 1 and Comparative Example 2. With these structures, it can be seen that when an initial luminance of the OLED device was assumed as 100%, there was a luminance drop of about 5% after a lapse of about 125 hrs.

That is, in the OLED device according to an exemplary embodiment of the present disclosure, the thickness of the second hole transporting layer is greater than the thickness of the first hole transporting layer. Thus, it can be seen that a lifetime of the OLED device including the plurality of patterned light emitting layers emitting green lights was increased by about 8%.

In the OLED device 1000 according to an exemplary embodiment of the present disclosure illustrated in FIG. 1 through FIG. 3, if the plurality of patterned light emitting layers 423 and 427 emit red lights, the thickness T3 of the first hole transporting layer 422 and the thickness T4 of the second hole transporting layer 426 may be applied as listed in the above Table 1 to a structure. Similar to FIG. 5 and FIG. 6, FIG. 7 is a graph illustrating a result of evaluation on a lifetime of the above-described structure according to Comparative Examples and Example.

Referring to FIG. 7, the thickness T4 of the second hole transporting layer is greater than the thickness T3 of the first hole transporting layer in a structure according to Example. With this structure, it can be seen that when an initial luminance of the OLED device was assumed as 100%, there was a luminance drop of about 5% after a lapse of about 1,100 hrs.

In comparison, the thickness T4 of the second hole transporting layer is smaller than the thickness T3 of the first hole transporting layer in structures according to Comparative Example 1 and Comparative Example 2. With these structures, it can be seen that when an initial luminance of the OLED device was assumed as 100%, there was a luminance drop of about 5% after a lapse of from about 750 hrs to about 900 hrs.

That is, in the OLED device according to an exemplary embodiment of the present disclosure, the thickness of the second hole transporting layer is greater than the thickness of the first hole transporting layer. Thus, it can be seen that a lifetime of the OLED device including the plurality of patterned light emitting layers emitting red lights was greatly increased by from about 22% to about 47%.

Figure 8:
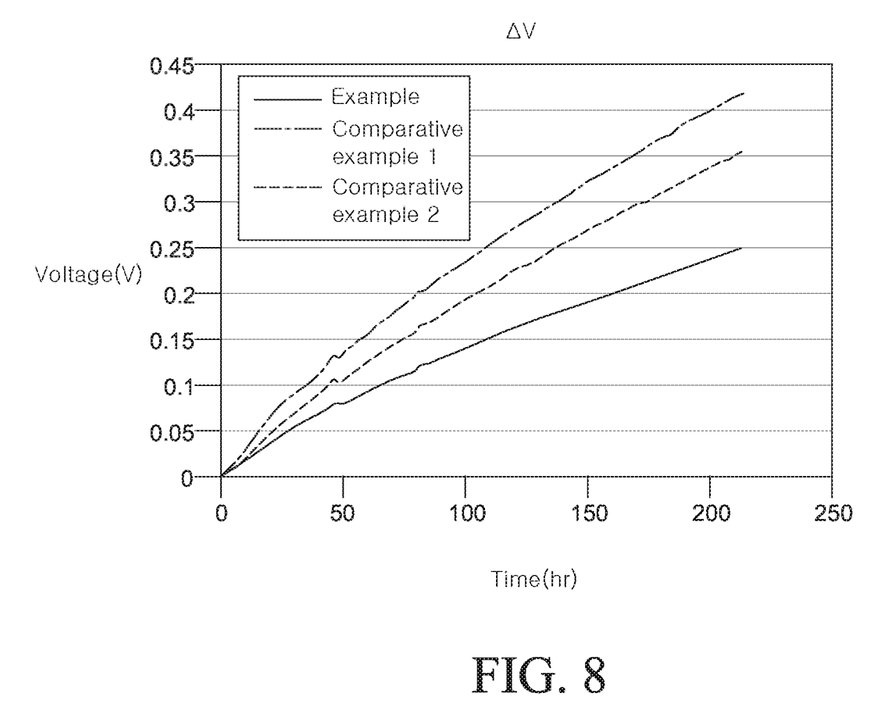
FIG. 8 is a graph illustrating a result of evaluation on delta voltage according to Comparative Examples and Example of the present disclosure.

FIG. 8 is a graph illustrating a result of evaluation on delta voltage according to Comparative Examples and Example of the present disclosure. If the plurality of patterned light emitting layers 423 and 427 emit blue lights, the thickness T3 of the first hole transporting layer 422 and the thickness T4 of the second hole transporting layer 426 may be applied as listed in the above Table 1 to the structure illustrated in FIG. 5. FIG. 8 is a graph illustrating a result of evaluation on a delta voltage $\Delta V$ of the above-described structure according to Comparative Examples and Example. The delta voltage exhibits a difference between an initial driving voltage and a driving voltage changed according to a time. An increase in delta voltage means that a driving voltage is increased that much.

Referring to FIG. 8, with the structure where the thickness T4 of the second hole transporting layer is greater than the thickness T3 of the first hole transporting layer according to Example, it can be seen that a delta voltage was about 0.2 V after the OLED device was driven for about 150 hrs. That is, it can be seen that a driving voltage was increased by about 0.2 V as compared with an initial driving voltage.

In comparison, with the structures where the thickness T4 of the second hole transporting layer is smaller than the thickness T3 of the first hole transporting layer according to Comparative Example 1 and Comparative Example 2, it can be seen that delta voltages were about 0.26 V and about 0.32 V after the OLED device was driven for about 150 hrs. That is, it can be seen that driving voltages were increased by about 0.26 V and about 0.32 V as compared with an initial driving voltage and also increased by about 30% and about 50% as compared with Example.

That is, in the OLED device according to an exemplary embodiment of the present disclosure, the thickness of the second hole transporting layer is greater than the thickness of the first hole transporting layer. Thus, it can be seen that an increase in driving voltage and delta voltage of the OLED device including a plurality of patterned light emitting layers emitting blue lights was solved.

As described above, in the OLED device according to an exemplary embodiment of the present disclosure, the first hole transporting layer and the second hole transporting layer have a thickness ratio for minimizing an increase in driving voltage caused by shifts of emission zones in a plurality of patterned light emitting layers due to prolonged driving. Therefore, it is possible to solve a problem of an increase in power consumption of the OLED device and thus possible to improve a lifetime of the OLED device.

Further, in the OLED device according to an exemplary embodiment of the present disclosure, the thickness of the second hole transporting layer is greater than the thickness of the first hole transporting layer. Therefore, it is possible to minimize an increase in delta voltage or driving voltage of the OLED device even in the case of prolonged driving.

The exemplary embodiments of the present disclosure can also be described as follows:

According to an aspect of the present disclosure, there is provided an OLED device. The OLED device comprises a first light emitting unit between a first electrode and a second electrode, the first light emitting unit including a first hole transporting layer and a first light emitting layer and a second light emitting unit between the first light emitting unit and the second electrode, the second light emitting unit including a second hole transporting layer and a second light emitting layer that emits a light of the same color as a light emitted by the first light emitting layer. According to an exemplary embodiment of the present disclosure, the first hole transporting layer and the second hole transporting layer have a thickness ratio for minimizing an increase in driving voltage caused by a shift of an emission zone in the first light emitting layer or in the second light emitting layer due to prolonged driving. Therefore, it is possible to solve a problem of an increase in power consumption of the OLED device and thus possible to improve a lifetime of the OLED device.

The first hole transporting layer and the second hole transporting layer may have a thickness ratio that results in the emission zone in the first light emitting layer or in the second light emitting layer to be biased toward an upper part or biased toward a lower part with respect to a central part in the first light emitting layer or in the second light emitting layer. Therefore, it is possible to solve a problem of an increase in driving voltage of the OLED device and thus possible to improve a lifetime of the OLED device.

A thickness of the second hole transporting layer may be greater than a thickness of the first hole transporting layer. Therefore, it is possible to solve a problem of an increase in driving voltage of the OLED device and thus possible to improve a lifetime of the OLED device.

A thickness ratio of the first hole transporting layer to the second hole transporting layer may be within a range from 1:1.1 to 1:1.5. Therefore, it is possible to solve a problem of an increase in driving voltage of the OLED device and thus possible to improve a lifetime of the OLED device.

The sum of the thickness of the first hole transporting layer and the thickness of the second hole transporting layer may be within a range from 750 Å to 1,150 Å. Therefore, it is possible to solve a problem of an increase in driving voltage of the OLED device and thus possible to improve a lifetime of the OLED device.

The first hole transporting layer and the second hole transporting layer may be formed of the same material. Therefore, it is possible to solve a problem of an increase in driving voltage of the OLED device and thus possible to improve a lifetime of the OLED device.

A distance between the first electrode and the second electrode may be within a range from 1,700 Å to 3,000 Å, which results in constructive interference being generated between a light emitted from the first light emitting layer and light emitted from the second light emitting layer due to micro-cavity effects. Therefore, it is possible to improve light efficiency and a lifetime of the OLED device.

A distance between the first light emitting layer and the second light emitting layer may be within a range from 500 Å to 750 Å. Therefore, it is possible to improve light efficiency and a lifetime of the OLED device.

The first light emitting layer and the second light emitting layer may have a patterned structure divided for each pixel, respectively, and the first hole transporting layer and the second hole transporting layer may have a common structure disposed throughout a plurality of pixels, respectively.

According to another aspect of the present disclosure, there is provided an OLED device of a top-emission type that includes a plurality of pixels adjacent to each other. The OLED device comprises a plurality of first electrodes respectively corresponding to the plurality of pixels and spaced apart from each other and a first common hole transporting layer on the plurality of first electrodes. Further, the OLED device comprises a plurality of first patterned light emitting layers on the first common hole transporting layer corresponding to the plurality of pixels, respectively, a second common hole transporting layer, on the plurality of first patterned light emitting layers, having a greater thickness than the first common hole transporting layer, a plurality of second patterned light emitting layers on the second common hole transporting layer corresponding to the plurality of pixels, respectively, and a second electrode on the plurality of second patterned light emitting layers. Therefore, it is possible to solve a problem of an increase in driving voltage or delta voltage of the OLED device.

A thickness ratio of the first common hole transporting layer to the second common hole transporting layer may be within a range from 1:1.1 to 1:1.5. Therefore, it is possible to solve a problem of an increase in driving voltage of the OLED device and thus possible to improve a lifetime of the OLED device.

The first common hole transporting layer and the second common hole transporting layer may be formed of the same material. Therefore, it is possible to solve a problem of an increase in driving voltage of the OLED device and thus possible to improve a lifetime of the OLED device.

The sum of the thickness of the first common hole transporting layer and the thickness of the second common hole transporting layer may be within a range from 750 Å to 1,150 Å. Therefore, it is possible to solve a problem of an increase in driving voltage of the OLED device and thus possible to improve a lifetime of the OLED device.

In each of the plurality of pixels, a distance between the first electrode and the second electrode may be within a range from 1,700 Å to 3,000 Å, which results in constructive interference being generated between a light emitted from the first patterned light emitting layer and a light emitted from the second patterned light emitting layer due to micro-cavity effects. Therefore, it is possible to improve light efficiency and a lifetime of the OLED device.

A distance between the first patterned light emitting layer and the second patterned light emitting layer may be within a range from 500 Å to 750 Å. Therefore, it is possible to improve light efficiency and a lifetime of the OLED device.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device comprising:
   a first light emitting unit between a first electrode and a second electrode, the first light emitting unit including a first hole transporting layer and a first light emitting layer; and
   a second light emitting unit between the first light emitting unit and the second electrode, the second light emitting unit including a second hole transporting layer and a second light emitting layer that emits a light of the same color as a light emitted by the first light emitting layer,
   wherein a thickness of the second hole transporting layer is greater than a thickness of the first hole transporting layer.

2. The organic light emitting display device according to claim 1, wherein the first hole transporting layer and the second hole transporting layer have a thickness ratio that results in the emission zone in the first light emitting layer or in the second light emitting layer to be biased toward an upper part or biased toward a lower part with respect to a central part in the first light emitting layer or in the second light emitting layer.

3. The organic light emitting display device according to claim 1, wherein a thickness ratio of the first hole transporting layer to the second hole transporting layer is within a range from 1:1.1 to 1:1.5.

4. The organic light emitting display device according to claim 3, wherein a sum of the thickness of the first hole transporting layer and the thickness of the second hole transporting layer is within a range from 750 Å to 1,150 Å.

5. The organic light emitting display device according to claim 4, wherein the first hole transporting layer and the second hole transporting layer are formed of the same material.

6. The organic light emitting display device according to claim 5, wherein a distance between the first electrode and the second electrode is within a range from 1,700 Å to 3,000 Å, which results in constructive interference being generated between light emitted from the first light emitting layer and light emitted from the second light emitting layer due to micro-cavity effects.

7. The organic light emitting display device according to claim 6, wherein a distance between the first light emitting layer and the second light emitting layer is within a range from 500 Å to 750 Å.

8. The organic light emitting display device according to claim 7, wherein the first light emitting layer and the second light emitting layer have a patterned structure divided for each pixel, respectively, and the first hole transporting layer and the second hole transporting layer have a common structure disposed throughout a plurality of pixels, respectively.

9. An organic light emitting display device of a top-emission type that includes a plurality of pixels adjacent to each other, the organic light emitting display device comprising:

a plurality of first electrodes respectively corresponding to the plurality of pixels and spaced apart from each other;

a first common hole transporting layer on the plurality of first electrodes;

a plurality of first patterned light emitting layers on the first common hole transporting layer corresponding to the plurality of pixels, respectively;

a second common hole transporting layer, on the plurality of first patterned light emitting layers, having a greater thickness than the first common hole transporting layer;

a plurality of second patterned light emitting layers on the second common hole transporting layer corresponding to the plurality of pixels, respectively; and a second electrode on the plurality of second patterned light emitting layers.

10. The organic light emitting display device according to claim 9, wherein a thickness ratio of the first common hole transporting layer to the second common hole transporting layer is within a range from 1:1.1 to 1:1.5.

11. The organic light emitting display device according to claim 10, wherein the first common hole transporting layer and the second common hole transporting layer are formed of the same material.

12. The organic light emitting display device according to claim 11, wherein the sum of the thickness of the first common hole transporting layer and the thickness of the second common hole transporting layer is within a range from 750 Å to 1,150 Å.

13. The organic light emitting display device according to claim 12, wherein in each of the plurality of pixels, a distance between the first electrode and the second electrode is within a range from 1,700 Å to 3,000 Å, which results in constructive interference being generated between a light emitted from the first patterned light emitting layer and a light emitted from the second patterned light emitting layer due to micro-cavity effects.

14. The organic light emitting display device according to claim 13, wherein a distance between the first patterned light emitting layer and the second patterned light emitting layer is within a range from 500 Å to 750 Å.

* * * * *